(12) United States Patent
Scholtz

(10) Patent No.: US 12,238,449 B2
(45) Date of Patent: *Feb. 25, 2025

(54) INFRARED IMAGER AND RELATED SYSTEMS

(71) Applicant: James I. Scholtz, New York, NY (US)

(72) Inventor: James I. Scholtz, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,364

(22) Filed: May 27, 2022

(65) Prior Publication Data

US 2022/0311955 A1   Sep. 29, 2022

Related U.S. Application Data

(63) Continuation of application No. 16/708,327, filed on Dec. 9, 2019, now Pat. No. 11,381,760.

(60) Provisional application No. 62/776,629, filed on Dec. 7, 2018.

(51) Int. Cl.
| | |
|---|---|
| *H04N 5/33* | (2023.01) |
| *H01L 27/146* | (2006.01) |
| *H04N 23/55* | (2023.01) |
| *G02B 1/11* | (2015.01) |

(52) U.S. Cl.
CPC ......... *H04N 5/33* (2013.01); *H01L 27/14649* (2013.01); *H04N 23/55* (2023.01); *G02B 1/11* (2013.01)

(58) Field of Classification Search
None
See application file for complete search history.

(56) References Cited

U.S. PATENT DOCUMENTS

| | | |
|---|---|---|
| 4,817,205 A | 3/1989 | Asawa |
| 6,377,716 B1 | 4/2002 | Veldhuis et al. |
| 6,385,362 B1 | 5/2002 | Norwood |
| 2003/0185664 A1 * | 10/2003 | Mitsui ............... H01L 21/681 |
| | | 700/245 |
| 2005/0281508 A1 | 12/2005 | Krupkin et al. |
| 2009/0079841 A1 | 3/2009 | Leard et al. |
| 2010/0119231 A1 | 5/2010 | Kim et al. |
| 2011/0168261 A1 | 7/2011 | Welser et al. |
| 2012/0081544 A1 | 4/2012 | Wee |
| 2018/0128975 A1 | 5/2018 | Tokushima et al. |

OTHER PUBLICATIONS

International Search Report issued in PCT Application No. PCT/US19/65300, dated Apr. 20, 2020.

* cited by examiner

*Primary Examiner* — Dave Czekaj
*Assistant Examiner* — Shanika M Brumfield
(74) *Attorney, Agent, or Firm* — Hoffmann & Baron, LLP

(57) ABSTRACT

An infrared imaging apparatus having thin-film spatial filters in a stacked array to filter and collate light generated internally by the infrared imaging apparatus such that the light generated impacts a detection area of the imaging apparatus at or near a critical angle. The index of refraction of the detection area being subject to change when irradiated with infrared light such that the amount of light generated internally and reflected to a light detector attached to the imaging apparatus varies with the intensity of the irradiating infrared light.

19 Claims, 9 Drawing Sheets

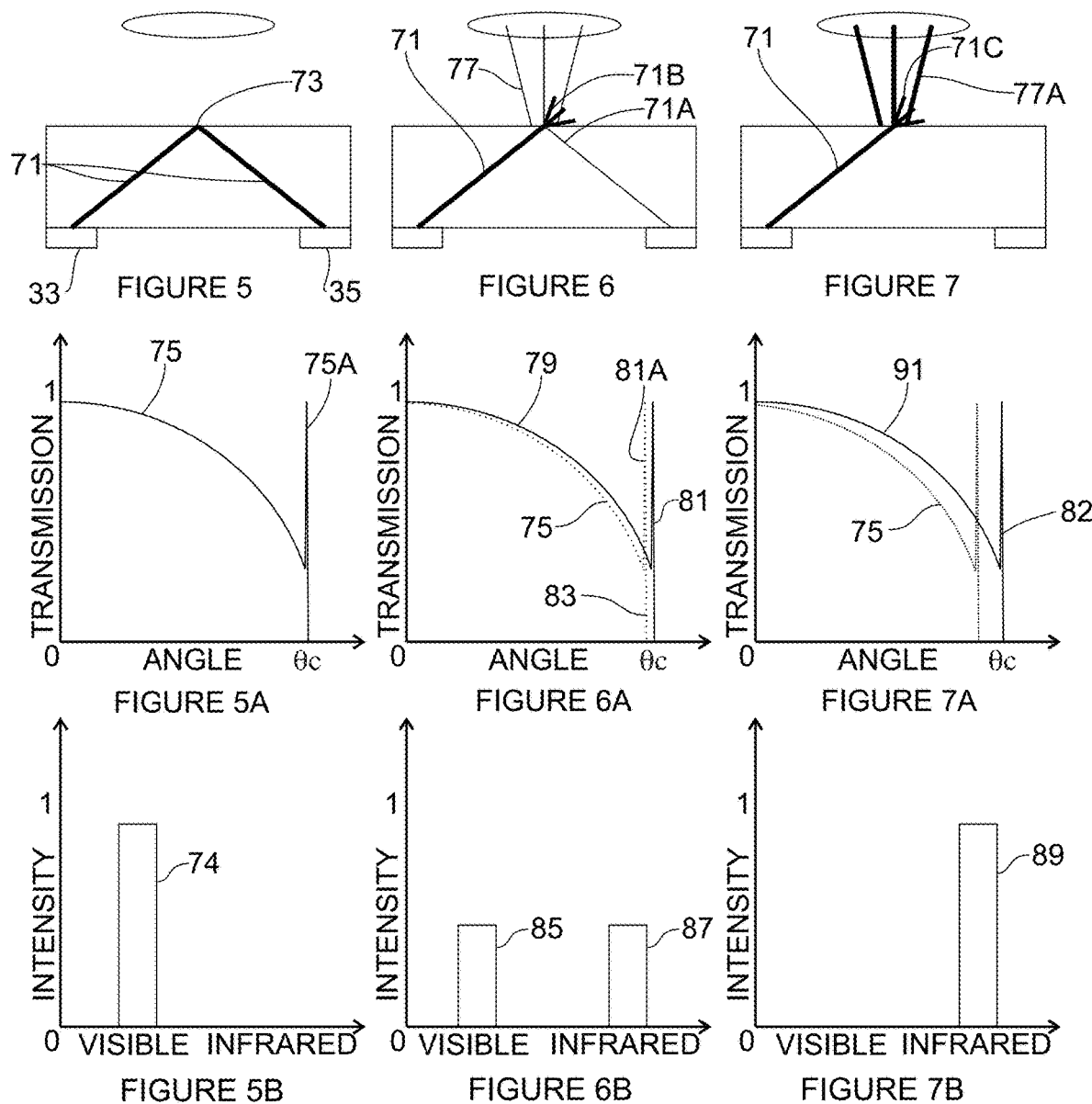

INFRARED IMAGER AND RELATED SYSTEMS

CROSS REFERENCE TO RELATED APPLICATIONS

The present application is a continuation of U.S. patent application Ser. No. 16/708,327 filed on Dec. 9, 2019, which in turn claims the benefit of priority to U.S. Provisional Application No. 62/776,629 filed on Dec. 7, 2018 and entitled "An Infrared Imager and Related Systems," the disclosures of which are incorporated by reference herein in their entireties for all purposes.

TECHNICAL FIELD

The disclosure relates generally to infrared camera, sensing and switching devices, and more particularly it relates to improved infrared camera, sensing and switching.

BACKGROUND

The technology of infrared cameras has existed for many decades, with their primary use being in military and scientific research applications. Many industrial and consumer applications are known, but have struggled to become viable markets due to the high cost and low image quality of the camera. Recently, progress has been made to bring "good enough" consumer, long-wavelength (8.0-15.0 µm) infrared cameras to market, which have fueled the rapid emergence of new niche applications. Significant, high value industrial applications typically operate in the short (1.4-3.0 µm) and mid- (3.0-8.0 µm) infrared wavelength range, where less technological progress towards consumer products has been made. Significant reductions in price and improvements in performance are necessary to enable greater adoption of this technology by industry, and to create new consumer markets. Currently, the most promising markets are military, security, law enforcement, fire fighters, optical gas imaging, and spectroscopy.

The size, weight, and power (SWaP) of infrared cameras greatly impacts their ease of use. These requirements are of critical importance in unmanned aerial vehicle (UAV) applications, and often determine maximum flight time if it is used on a drone. The greatest infrared camera SWaP challenges are in the mid-infrared (3.0-8.0 µm) range where materials used to fabricate cameras require cryogenic cooling. The required cooling unit adds cost, size and weight requiring significant power to operate. Thus, there is a need for a technology that eliminates the need for cryogenic cooling. Such a technology needs a fundamentally different principle for detection to thereby reduce the weight of the system significantly and thereby allow longer flight times on smaller cheaper UAVs. Thus, there is a need for light weight mid-infrared camera.

More than 1 billion silicon, visible light cameras are manufactured annually for use in smart phones. Market demands have driven the constant innovation and performance improvements made to visible light cameras resulting in falling production costs as a result of significant economy-of-scale. The challenge is now how to make an infrared light camera with similar price and performance that is now typical of visible cell phone cameras.

No admission is made that any reference cited herein constitutes prior art. Applicant expressly reserves the right to challenge the accuracy and pertinence of any cited documents.

SUMMARY

The invention also solves the enumerated problems by providing a spatial filter for the efficient transmission of light in a narrow range of angles at or near a critical angle having: a) a core layer with a high refractive index; b) an anti-reflective layer with a near critical angle and refractive index less than the core layer; c) a cladding detection layer with a low refractive index which is less than the refractive index of the anti-reflective layer; d) wherein the anti-reflective layer has a first side and second side, the first side of the anti-reflective layer is connected to a side of the cladding detection layer and the second side of the anti-reflective layer is connected to a first side of the core layer and where injected light from a light source optically coupled to a second side of the core layer is refracted through the core layer and through the anti-reflective layer and thereby enters the cladding layer at a predetermined angle near a critical angle of the injected light. In another variation of the spatial filter, the refractive index of the core layer, the anti-reflective layer, and the cladding layer can vary from 1 to 5 provided that the refractive index of the core layer is more than the refractive index of the anti-reflective layer and the cladding detection layer, and the refractive index of the anti-reflective layer is equal to or more than the refractive index of the cladding detection layer. Additionally, depending on the deposition process and materials chosen, these refractive index values can be within the range of 1.0-5.0. In yet another variation, the spatial filter is configured such that the refractive index of the cladding detection layer is 0.001 less than the refractive index of the anti-reflective layer. This difference in refractive index can have values within the range of 0-5.0.

The spatial filter irradiation of the infrared light on an exposed surface of the cladding detection layer changes the refractive index of the cladding detection layer and thereby changes a critical angle of refraction of injected light entering the cladding detection layer. In another variation of the spatial filter it has a predetermined angle of the injected light less than the critical angle when infrared radiation does not irradiate the exposed surface of the cladding detection layer and the injected light passes out through the exposed surface of the cladding detection layer, and when infrared radiation irradiates the exposed surface of the cladding detection layer the predetermined angle of the injected light is equal to or more than the critical angle of the injected light, and the injected light is reflected down through the anti-reflective layer. In another variation the spatial filter has a predetermined angle of injected light that is equal to or more than the critical angle when infrared radiation does not irradiate the exposed surface of the cladding detection layer and the injected light is reflected down through the anti-reflective layer, and when infrared radiation irradiates the exposed surface of the cladding detection layer the predetermined angle of the injected light is less than the critical angle of the injected light, which then passes out through the exposed surface of the cladding detection layer. In another variation the cladding detection layer of the spatial filter is made of a material with a positive thermo-optic coefficient. In yet another variation the material with a positive thermo-optic coefficient is a dielectric. In yet another variation of the spatial filter the cladding detection layer is made of a material with a negative thermo-optic coefficient. In yet another variation of the spatial filter, the material with a negative thermo-optic coefficient is a polymer. In yet another variation, the spatial filter has a light detector optically connected to the second side of the core layer that is positioned to receive light reflected from the cladding layer down through the anti-reflective and the core layer. In yet another variation, the spatial filter, the light source and the imaging apparatus are optically connected to the core layer by a substrate, the substrate being connected on a first side to the second side of the core layer and the substrate is optically connected to the light source and imaging apparatus on a second side of the substrate. In yet another variation, the spatial filter has at least two additional spatial filters sandwiched between the first side of the substrate and the second side of the core layer. In another variation of the spatial filter, the light detector is an imaging apparatus.

In another version, the spatial filter consists of at least two additional spatial filters that have: a) a second anti-reflective layer with a second side of the second anti-reflective layer connected to the first side of the substrate; b) a second layer with a high refractive index with a second side of the second layer with a high refractive index connected to a first side of the second anti-reflective layer; c) a third anti-reflective layer with a second side of the third anti-reflective layer connected to a first side of the second layer with a high refractive index; d) a second layer with a low refractive index with a second side of the second layer with a low refractive index connected to a first side of the third anti-reflective layer; and e) a fourth anti-reflective layer with a second side of the fourth anti-reflective layer connected to a first side of the second layer with a low refractive index, a first side of the fourth anti-reflective layer is connected to the second side of the core layer. In another variation, the spatial filter is fabricated using a plasma-enhanced chemical vapor deposition process.

The invention also provides an optical infrared (IR) imager having: a) a transparent substrate layer; b) a light source and a light detector spaced apart on a first side of the substrate layer; c) a spatial filter on a second side of the substrate layer, a first side of the spatial filter optically connected to the substrate and a cladding detection layer on a second side of the spatial filter, the cladding detection layer having a refractive index that is modulated by infrared light incident on an exterior surface of the cladding detection layer; d) wherein when the light source injects light into the substrate the injected light passes through the substrate into the spatial filter the injected light is spectrally and spatially filtered by wave interference and strong refraction such that the injected light impinges the cladding at a predetermined angle; and e) when infrared light impinges the exterior surface of the cladding detection layer the refractive index of the cladding detection layer is modulated and thereby changes the amount of injected light reflected through the spatial filter from the cladding detection layer through the spatial filter to the light detector. In one variation of the imager, the predetermined angle is slightly less than a critical angle of incidence of the injected light and when no infrared light impinges on the exterior surface of the cladding detection layer and the injected light passes out through the exterior surface of the cladding, and when infrared light impinges the exterior surface of the cladding detection layer the refractive index of the cladding detection layer is modulated such that the predetermined angle of the injected light at an angle equal to or more than the critical angle of incidence and the injected light is reflected from the cladding down through the spatial pass filter and the substrate to the light detector. In another variation of the imager, the predetermined angle is at or slightly more than a critical angle of incidence of the injected light when no infrared light impinges on the exterior surface of the cladding detection layer and the injected light is thereby reflected from the cladding detection layer down through the spatial filter and the substrate to the light detector and when infrared light impinges the exterior surface of the cladding detection layer the refractive index of the cladding detection layer is modulated such that the predetermined angle of the injected light is less than the critical angle of incidence and the injected light pass out through the cladding's exterior surface, thereby changing the amount of the injected light which is reflected off of the cladding down through the spatial filter to the light detector.

The invention provides another variation of the optical imaging device having: a) a light source; b) a spatial filter; c) a cladding detection layer; d) a light detector capable of receiving light from the light source that has passed through the spatial filter; and e) wherein the light source, the spatial filter, the cladding detection layer, and the light detector are optically connected and positioned with respect to each other such that when the light source emits light, the emitted light passes through the spatial filter and is directed by the spatial filter to the cladding detection layer where the light strikes the cladding detection layer at a predetermined angle and the cladding detection layer has variable refractive index subject to change when irradiated with infrared light on an exterior surface of the cladding detection layer it changes the refractive index of the cladding detection layer to thereby cause a change in the amount of emitted light the light detector receives through the spatial filter. In another variation of the optical imaging device the light source and the light detector are optically connected to the substrate by a connection system selected from a group of the following: an index matching epoxy, a prism, a Fresnel prism micro array, a fluorescent array, and a diffraction layer.

The present invention solves the existing problems with infrared camera technology and the available manufacturing processes by creating a new technology that enables visible light cell phone cameras to effectively detect and image infrared light. The invention provides an integrated photonic device that optically modulates visible light with the information contained in an infrared image by using a novel and proprietary thin-film optical structure. Visible light, from a Diode Laser (LD) or Light Emitting Diode (LED), which is made to have spatially uniform intensity, passes through the thin-film optical structure and is detected by a standard silicon camera. When an infrared image is projected onto the thin-film optical structure, the uniform intensity of the visible light is modulated in proportion to the spatially defined intensity of the infrared image. In this case, what passes through the optical structure is a visible image containing the infrared image's information. The visible image is then detected by a standard silicon visible camera.

The thin-film optical structure, the primary component of our infrared imager, is fabricated from common dielectric ($SiO_2$, $Si_3N_4$, $MgF_2$) materials using tools that are readily available, permitting high-volume, low-cost wafer-scale production. This avoids the need for fabrication of exotic semiconductor (InGaAs, InSb, and VOx) materials that are typically used in infrared cameras due to their sensitivity to infrared light. Instead the invention uses an existing visible camera as a component in the infrared imager, allowing the use of low-cost and high performance of visible cameras. Furthermore, the infrared imager is sensitive in the near, short, mid-, and long wavelength ranges permitting it to be used in applications across the spectrum. This novel technology will prove disruptive, making infrared cameras as ubiquitous as visible cameras. As history has proven, especially with the cell phone camera, making innovative tools available drives creative applications and emerging markets.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 5 is a schematic of an embodiment of the imager of the present invention with no infrared light shining on the imager and the internal light from the light source strikes the top surface of the imager from beneath at the critical angle;

FIG. 5A is a schematic graph of transmission intensity of the internal light in FIG. 5;

FIG. 5B is schematic graph of incident infrared light intensity at the top surface of the imager and internal light intensity at the measurement detector in FIG. 5;

FIG. 6 is a schematic of an embodiment of the imager of the present invention in FIG. 5 with infrared light shining in a 50% dynamic range on the imager;

FIG. 6A is a schematic graph of transmission intensity of the internal light in FIG. 6;

FIG. 6B is schematic graph of incident infrared light intensity at the top surface of the imager and internal light intensity at the measurement detector FIG. 6;

FIG. 7 is a schematic of an embodiment of the imager of the present invention in FIG. 5 with infrared light shining in a 100% dynamic range on the imager;

FIG. 7A is a schematic graph of transmission intensity of the internal light in FIG. 7;

FIG. 7B is schematic graph of incident infrared light intensity at the top surface of the imager and internal light intensity at the measurement detector FIG. 7;

DETAILED DESCRIPTION

I. Overview of Two Different Embodiments

Figure 1:
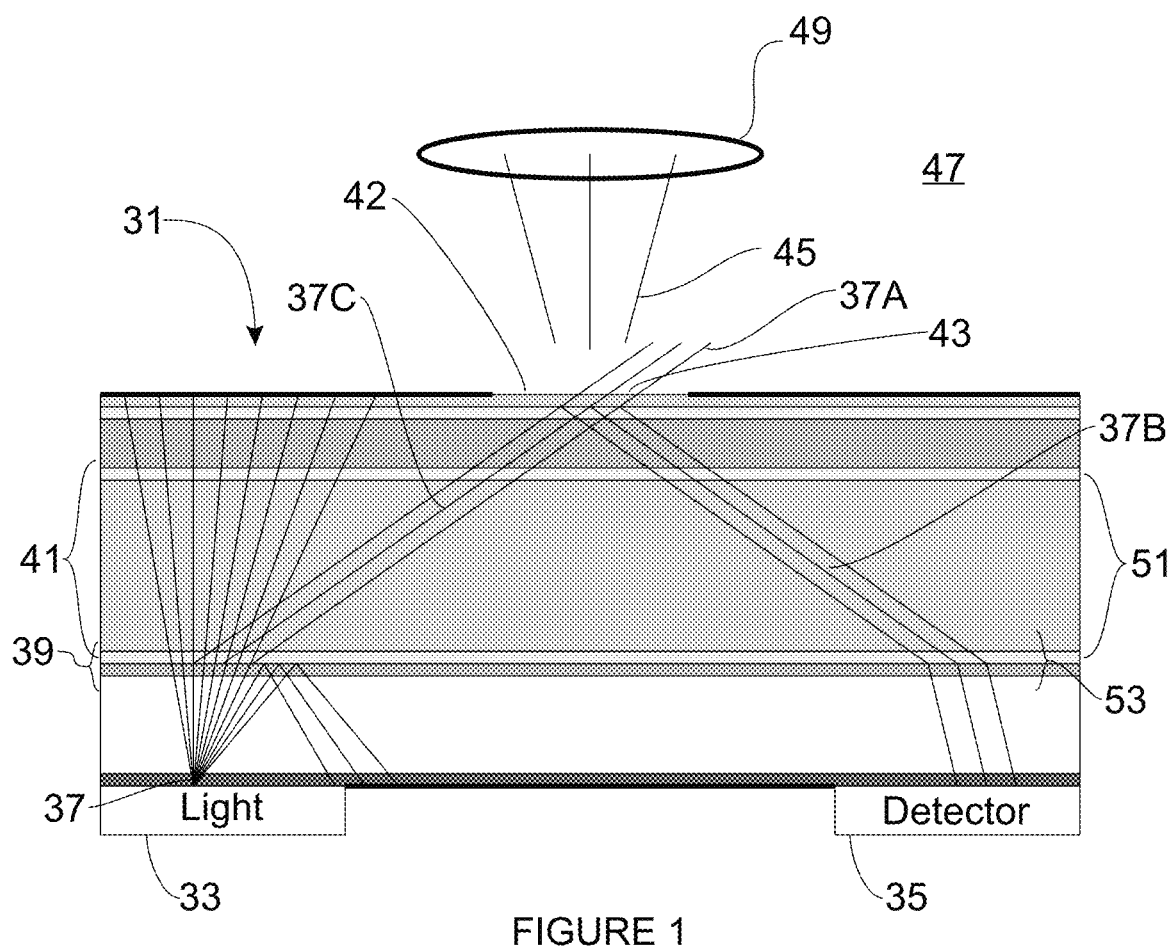
FIG. 1 is a schematic diagram of the functional sections of one embodiment of the invention.

FIG. 1 provides a schematic diagram identifying the functional areas of the optical infrared (IR) imager 31 of the present invention. Optical infrared imager 31 has at its bottom a light source 33 and detector 35 operatively connected to substrates 34 bottom. In region 39 imager 31 has a series of transparent layers of different refractive index (RI) that act as spectral and spatial filters that process the light 37 passing through to create a defined reference source and beam 37. The light 37 passes through region 41 which further spatially filters and laterally displaces the direction of the path of the refined beam of light toward the detection region 43. In detection region 43 the refractive index can be set in different ways for different embodiments or functions. One embodiment is to configure of the transparent layers are set such that when no infrared light is reaching detection region 43 light beam 37 arrives at an angle that is slightly less than its critical internal angle. The critical angle is the minimum angle at which total internal reflection (TIR) occurs, where all light above the critical angle is 100% reflected. Thus, when light beam 37 arrives at detection area 43 it is scattered and transmitted out of imager 31 into the area 47, typically air above imager 37A. However, given the makeup of the layers in detection region 43, when IR light 45 is shined or focused by lens 49 on region 43 it causes a change in the refractive index (RI) of region 43 causing the critical angle of the boundary to change and in fact the internal light's angle is closer to the critical angle or higher such that it is reflected beam 37B down towards the light detector 35. It passes down through various layers that act as displacement and spatial filters in region 51 and then through various layers that act as spectral, spatial and noise filters to then arrive at light detector 35. As will be discussed below in detail, detection region 43 consists of three different layers. It should be noted that the critical angle is dependent on the refractive index value of high-index core layer and low-index cladding layer.

In an alternative embodiment, cladding layer 42 in detection region 43 can be configured such that when no infrared light 45 is irradiating cladding layer 42 when light beam 37C arrives at detection region 43, it arrives at its critical angle and is reflected as beam 37B back into imager 31. In this embodiment, when infrared light shines or is focused in region 43 the critical angle of the light is lowered and it is transmitted out 37A of imager 31 into region 47.

A. One Variation of the Invention

FIGS. 2, 2A, 2B, 3, 3A, 3B, 4, 4A and 4B to be discussed in the following paragraphs relate to the variation of the invention where the critical angle is slightly higher than the angle the internally generated light is when it arrives at detection area 43 when there is no infrared light irradiating the detection region and thus, it will scatter and exit through the top layer of imager 31. However, as soon as infrared light shines on detection area 43 the critical angle shifts lower and some or all of the internal light is internally reflected towards detector 35.

Figure 2:
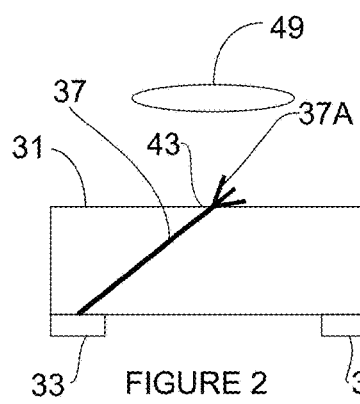
FIG. 2 is a schematic diagram of an embodiment of the imager of the present invention with no infrared light incident on the imager and the critical angle is slightly larger than the angle at which the light from the light source strikes the top surface of the imager.
Figure 2A:
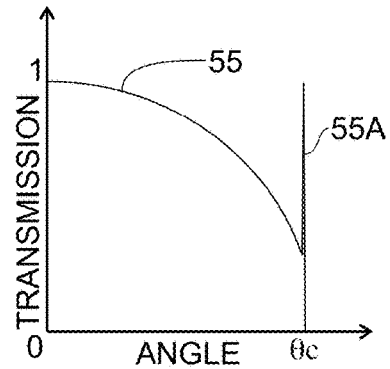
FIG. 2A is a schematic graph of transmission intensity of the internal light in FIG. 2.
Figure 2B:
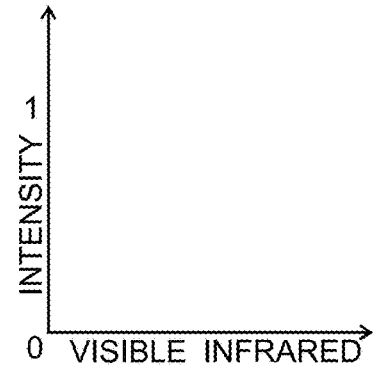
FIG. 2B is schematic graph of incident infrared light intensity at the top surface of the imager and internal light intensity at the measurement detector in FIG. 2.

FIG. 2 is a schematic diagram of the embodiment of the imager 31 where light 37 generated by light source 33 impacts the detection region 43 at an angle slightly less than the critical angle and there is no infrared light incident on the detection region 43. In such a situation the light 37A exits the top surface of imager 31 and is not reflected back down to imager detector 33. FIG. 2A is a schematic of a graph of the transmission intensity through a single thin-film stack versus internal light incident angle, where the y-axis is transmission intensity and the x-axis is the angle of incidence, and spike 55A is the total transmitted internal light. Since no infrared light is incident on detection region 43, all of the light 37 is transmitted into the top layer and is scattered out of the imager. The scattering can be due to nano-particles embedded in the layer, or fabrication of optical structures, such as pyramids, on the top surface. The transmission curve 55 is smooth as it approaches the critical angle, 0, with a spike 55A just prior. FIG. 2B is a schematic diagram of a bar graph of light intensity y-axis of light received at detector 35 and infrared light incident at detection region 43 shows that in this situation there is none.

Figure 3:
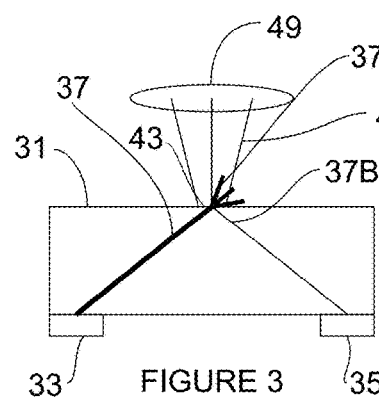
FIG. 3 is a schematic of an embodiment of the imager of the present invention in FIG. 2 with IR light shining in a 50% dynamic range on the imager.
Figure 3A:
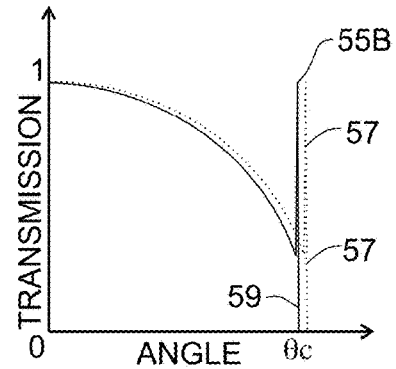
FIG. 3A is a schematic graph of transmission intensity of the internal light in FIG. 3.
Figure 3B:
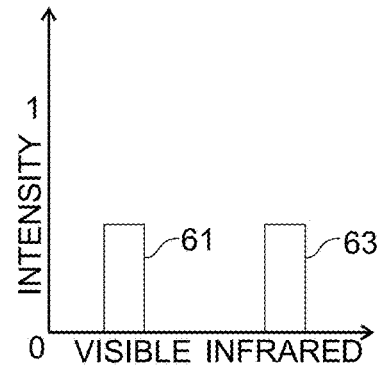
FIG. 3B is schematic graph of incident infrared light intensity at the top surface of the imager and internal light intensity at the measurement detector in FIG. 3.

FIG. 3 is a schematic diagram of the setup in FIG. 2 with infrared light at 50% dynamic range intensity striking detection region 43. The dynamic range of the detection device 35 is set by its integration time. In FIG. 3, some of the light 37B generated by light source 33 remains in imager 31 and is reflected down towards detection device 35, which can be a simple light detector or camera. The transmission curve is smooth as it approaches the critical angle, $\theta_C$, with a spike 55B at the new critical angle 59. FIG. 3A is a graph of transmission intensity through the thin-film stack or filters and the internal incident angle of light 37 generated by light source 33 in the situation depicted in FIG. 3 where infrared light 45 is incident on detection area 43. In this instance, there is a shift caused by the boundary between the layers of the critical angle $\theta_C$ of light 37 that results in reflection of the light 37B towards receptor 35. Dotted outline 57 shows the original location of the critical angle when there was no incident infrared light on detection area 43 as depicted in FIGS. 2 and 2A. Thus, the infrared light 45 has caused a shift as depicted in FIG. 3A in the critical angle $\theta_C$ from 57 to 59. FIG. 3B indicates internal light intensity and incident infrared light intensity, the y-axis indicating the amount of intensity. Internal light intensity 61 is measured at detector 35 and infrared light intensity 63 is measured in detection region 43. As depicted in the graph in FIG. 3B, they are equal. The bar graphs are meant to be descriptive or illustrative of the concept and not precise. In actuality, the variation tends to be a nonlinear process.

Figure 4:
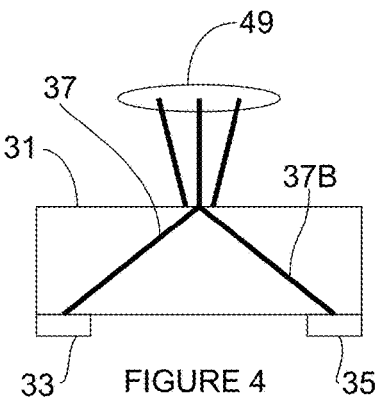
FIG. 4 is a schematic of an embodiment of the imager of the present invention in FIG. 2 with infrared light shining in a 100% dynamic range on the imager.
Figure 4A:
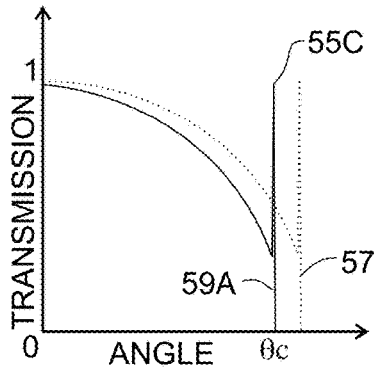
FIG. 4A is a schematic graph of transmission intensity of the internal light in FIG. 4.
Figure 4B:
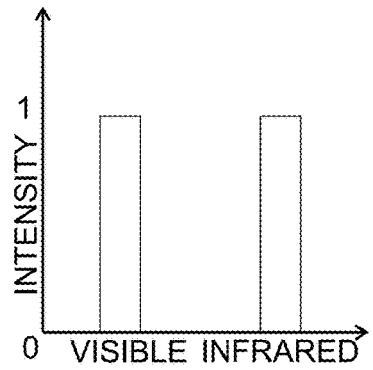
FIG. 4B is schematic graph of incident IR light intensity at the top surface of the imager and internal light intensity at the measurement detector of FIG. 4.

FIG. 4 is a schematic diagram of an embodiment of the imager of the present invention in FIG. 2 with infrared light shining in a 100% dynamic range on detection region 43. As depicted in FIG. 4, the light 37 generated by light source 33 and transmitted through the reference region is reflected back down 37B toward detector 35. FIG. 4A is a graph of transmission intensity through the thin-film stack or filters and the internal incident angle of light 37 generated by light source 33 in the situation depicted in FIG. 4 where infrared light 45 is incident on detection area 43. In this instance, there is a shift of the critical angle $\theta_C$ caused by the difference in refractive indexes at the boundary of light 37 that results in reflection of the light 37B towards detector 35. Dotted outline 57 shows the original location of the critical angle when there was no incident infrared light on detection area 43 as depicted in FIGS. 2 and 2A. Thus, the infrared light 45 has caused a further shift in the location of the critical angle as depicted in FIG. 4A from 57 to 59A. FIG. 4B indicates internal light intensity and incident infrared light intensity, the y-axis indicating the amount of intensity. Internal light intensity 61 is measured at detector 35 and infrared light intensity 63 is measured in detection region 43. As indicated by the bar graphs 61A for the internal light and 63A for the incident IR light, both have increased. The bar graphs are meant to be descriptive or illustrative of the concept and not precise.

B. A Second Variation of the Invention

FIGS. 5, 5A, 5B, 6, 6A, 6B, 7, 7A, and 7B to be discussed in the following paragraphs relate to another variation of the invention. In this variation, the angle at which the internally generated light arrives at the detection area 73 when no IR light is shining on detection area 73 is at the critical angle.

FIG. 5 is a schematic diagram of the embodiment of the imager 31 where light 71 generated by light source 33 impacts the detection region 73 at an angle that is at or more than the critical angle and there is no infrared light incident on the detection region 73. In such a situation, all the light 71 is reflected down to imager detector 35. FIG. 5A is a schematic of a graph of the transmission intensity 75 through a single thin-film stack versus internal light incident angle, where y-axis is transmission intensity and the x-axis is the angle of incidence, and spike 75A is the total transmitted internal light reflected towards light source 35. Since no infrared light is incident on detection region 73, all of the light 71 is reflected down to imager 35. The transmission curve 75 is smooth as it approached the critical angle, $\theta_C$, with a spike 75A. FIG. 5B is a schematic diagram of a bar graph of light intensity y-axis of light 74 received at detector 35 with no infrared light incident at detection region 73.

FIG. 6 is a schematic diagram of the setup in FIG. 5 with infrared light 77 at 50% dynamic range intensity striking detection region 73. The dynamic range of the detection device 35 is set by its integration time. In FIG. 6, some of the light 71A generated by light source 33 remains in imager 31 and is reflected down towards detection device 35, which can be a simple light detector or camera. Some of the light 71B passes out of imager 31 at detection region 73. Referring to FIG. 6A, the transmission curve 79 is smooth as it approaches the critical angle, $\theta_C$, with a spike 81 at the new critical angle 83. FIG. 6A a graph of transmission intensity through the thin-film stack or filters and the internal incident angle of light 71 generated by light source 33 in the situation depicted in FIG. 6 where infrared light 77 at 50% intensity is incident on detection area 73. In this instance, there is a shift caused by the boundary between the layers of the critical angle $\theta_C$ of light 71 that results in reflection of the light 71B out of imager 31 as well as some light 71A towards detector 35. Dotted outline 75 in FIG. 6A shows the original location of the critical angle when there was no incident infrared light on detection area 73 as depicted in FIGS. 5 and 5A. Thus, the infrared light 77 has caused a shift as depicted in FIG. 6A in the critical angle $\theta_C$ from 75 to 81. FIG. 6B indicates internal light intensity and incident IR light intensity, the y-axis indicating the amount of intensity. Internal light intensity 85 is measured at detector 35 and infrared light intensity 87 is measured in detection region 73. As depicted in the graph in FIG. 6B, they are equal. The bar graphs are meant to be descriptive or illustrative of the concept and not precise.

FIG. 7 is a schematic diagram of an embodiment of the imager of the present invention in FIG. 5 with infrared light shining in a 100% dynamic range on detection region 73. As depicted in FIG. 7, the light 71 generated by light source 33 and transmitted through the reference region passes out of imager 31, none of it being reflected back down toward detector 35, all of the light 71 generated by light source 33 passes out of imager. FIG. 7A is a graph of transmission intensity 91 through the thin-film stack or filters and the internal incident angle of light 71 generated by light source 33 in the situation depicted in FIG. 7 where infrared light 77 is incident on detection area 73. In this instance, there is a shift of the critical angle $\theta_C$ caused by the difference in refractive indexes at the boundary of light 71 that results in passage of all of the light 71C out of imager 31 and not down to light detector 35. Dotted outline 75 shows the original location of the critical angle when there was no incident infrared light on detection area 73 as depicted in FIGS. 5 and 5A. Thus, the infrared light 77 has caused a further shift in the location of the critical angle as depicted in FIG. 7A from 75 to 82. FIG. 7B indicates internal light intensity and incident infrared light intensity, the y-axis indicating the amount of intensity. Internal light intensity is measured at detector 35 and infrared light intensity 77A is measured in detection region 73. As indicated for the internal light intensity is zero since it is all passing out of imager 31 with the incident infrared light being at a maximum. The bar graphs are meant to be descriptive or illustrative of the concept and not precise.

II. Detailed Description of the Structure of a Preferred Embodiment

Figure 8:
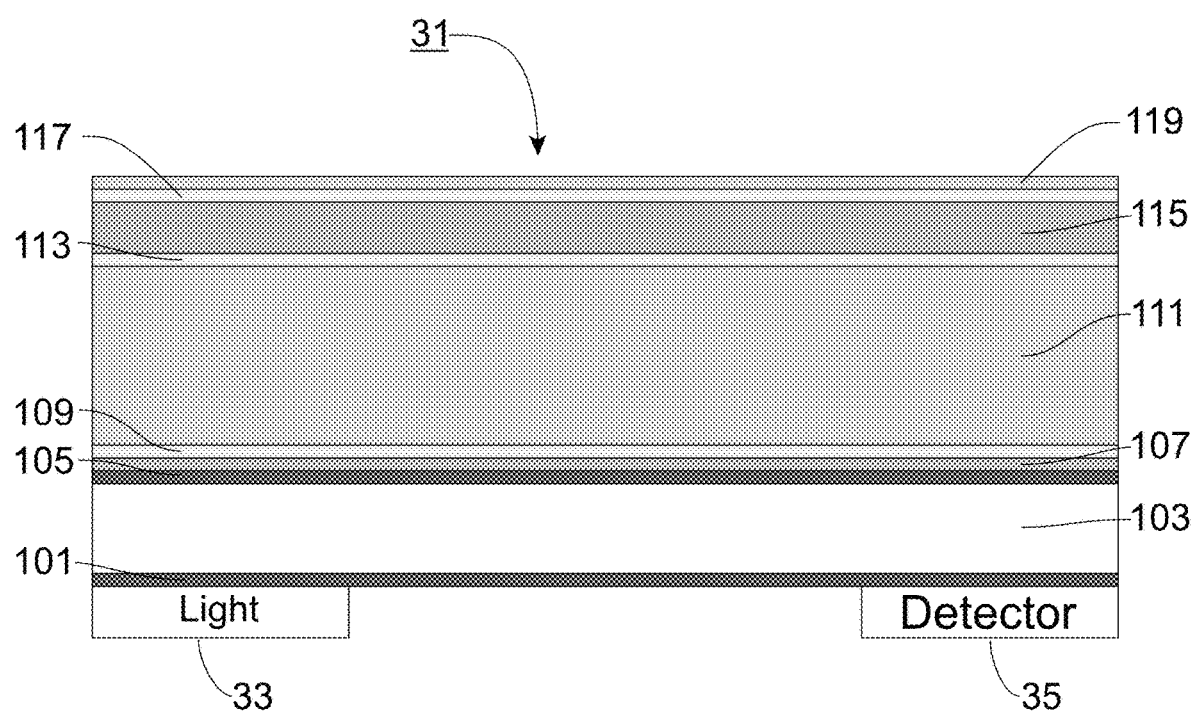
FIG. 8 is a detailed schematic diagram of one preferred embodiment of the present invention.

FIG. 8 provides a detailed schematic diagram of one preferred embodiment of the present invention. Infrared imager 31 has a light source 33 and light detector 35 which attach by an optical coupling layer 101, to substrate 103. An anti-reflection coating 105 is deposited on substrate 103, in turn high refractive index layer 107 is next with near-critical angle, anti-reflective layer 109. In turn next is a low refractive index layer 111 and in turn another near-critical angle, anti-reflective layer 113 and then another high refractive index layer 115, another anti-reflective layer 117, and then as the top layer a specialized low refractive index layer 119. In a preferred embodiment, the various layers are deposited in a standard semiconductor fabrication process, such as Plasma Enhanced chemical Vapor Deposition, or PECVD.

Regarding each of the layers in this embodiment depicted in FIG. 8, the following are specifics for one variation of this embodiment:

Description of Layers of FIG. 8

103 Substrate: refractive index n1: transparent, rigid substrate, its primary purpose is as a foundation for layer growth. Typical materials are Borosilicate Glass (BK7), Fused Silica (FS), or Sapphire.

107 High Refractive Index Layer: refractive index n2: This is an amorphously grown layer with relatively high refractive index. Potential materials are silicon nitride ($SiN_3$, n=2.0), oxynitride ($SiN_xO$, n=1.46-1.9), or Indium Tin Oxide (ITO, n=1.85).

109 Near-Critical Angle, Anti-Reflective Layer: refractive index n3: This is an amorphously grown layer with relatively low refractive index. Its refractive index is approximately 0.001 less than "Low Refractive Index Layer, n4." This layer's thickness is a critical dimension, and is calculated from thin-film interference theory. (A summary of the applicable equations of thin-film theory is provide at the end of this specification.)

111 Low Refractive Index Layer: refractive index n4: This is an amorphously grown layer with relatively low refractive index. Possible materials are silicon dioxide ($SiO_2$, n=1.46) and oxynitride ($SiN_xO$, n=1.46-1.90). It has the lowest refractive index of all layers. This layer's thickness is determined by the distance of lateral displacement, due to refraction, that is needed in the device. The thicker the layer, the greater the displacement. Stated differently, the lateral distance between the "reference," "detection," and "measurement" regions is determined by the thickness of this layer.

113 Near-Critical Angle, Anti-Reflective Layer: refractive index n3: This layer is identical to 109 in terms of material, refractive index, and thickness.

115 High Refractive Index Layer: refractive index n2: This layer is identical to 107 in terms of material and refractive index, but not necessarily thickness. Its purpose is to shield the underlying layers from infrared light and act as a thermal buffer between the infrared absorption layer above and the underlying layers. Certain materials, such as ITO, are highly reflective to infrared light, and can serve to reflect infrared light incident that has passed through 119 and 117 back through, effectively doubling the light path length and increasing infrared absorption.

117 Near-Critical Angle, Anti-Reflective Layer: refractive index n3: This layer is identical to 109 and 113 in terms of material, refractive index, and thickness.

119 Low Refractive Index Layer: refractive index n4: This layer is typically (but not in all possible designs) identical to layer 111 in terms of refractive index, but not necessarily material or thickness. Possible materials for this layer are $SiO_2$, $SiN_x$, PMMA, (n=1.51), or SU-8 (n=1.58).

The thickness of this layer should be as thin as possible to minimize its thermal mass. This layer should be translucent, scattering both internal visible light and incident infrared light. There are many known methods for achieving this, the most promising being embedded nano-particles, randomly textured surface, or structured patterning of the surface, specifically with a micro-pyramid structure. For the internal visible light, this layer scatters the transmitted light in the "detection region" either out of the thin-film layers or at angles that will be filtered by the "measurement region." For the infrared light, scattering can increase the light path length in layer and increase the absorption. This layer must also be highly absorbing to infrared light, either natively or by the additional of a blackbody absorbing material.

Regarding layer 119 (42 of FIG. 1), it is the most significant layer of imager 31. As depicted in FIGS. 1 and 8, imager 31 is a stack of layers in the order of n2, n3, and n4 of varying thickness. Each layer is homogenous and planar, except for the final, top layer 119, furthest from substrate 103 in the stack of layers depicted in FIG. 8. As noted above, layer 119 is configured to react to infrared light with a change in the refractive index when infrared light irradiates coating or cladding 119 it causes internal light 37 in FIG. 1 emitted by light source 33 that arrives at layer 119 to change course and either be passed out through layer 119 out of imager 31 or remain in the imager and be reflected down towards the detector 35. Various polymer and dielectric materials can be configured to change the refractive index of layer 119 when irradiated by infrared light and thus cause a change in the direction of the light emitted by the light source due to a change of the critical angle for the emitted light arriving at coating 119. Such change could be at or greater than the critical angle of refraction and direct emitted internal light that was going to pass out of imager 31 down towards detector 35. Alternatively, the change in the refractive index could be such that emitted internal light will arrive at an angle less than the critical angle and thus pass out of layer 119 into region 47, whereas if no infrared light had been irradiating layer 119 it would have remained as interior light and have been reflected down towards detector 35.

105 Standard Anti-Reflection Coating: Depending on the refractive index of the substrate 103, this layer can be a simple oblique angle, quarter wavelength, or a near-critical angle, anti-reflection coating if the substrate 103 and the low refractive index layer 111 have similar refractive indexes.

Figure 9A:
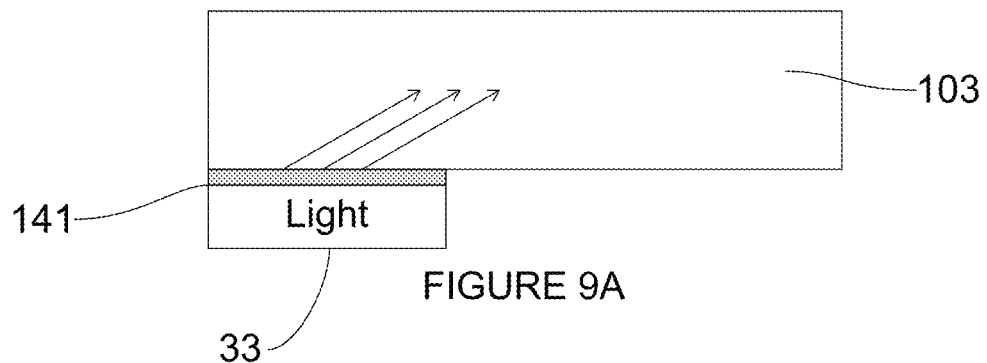
FIG. 9A is a schematic diagram of a means for optically bonding the light source to the substrate using optical epoxy and matching the refractive index of the light source and substrate.
Figure 9B:
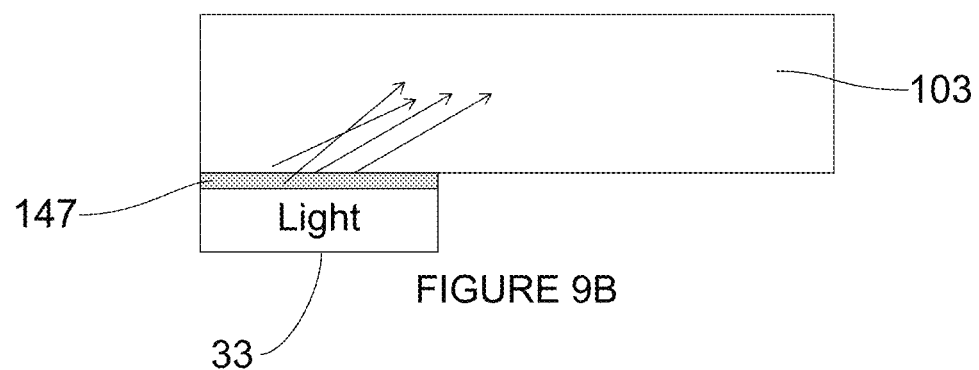
FIG. 9B is a schematic diagram of a means for optically bonding the light source to the substrate using random surface texturing with an diffuser.
Figure 9C:
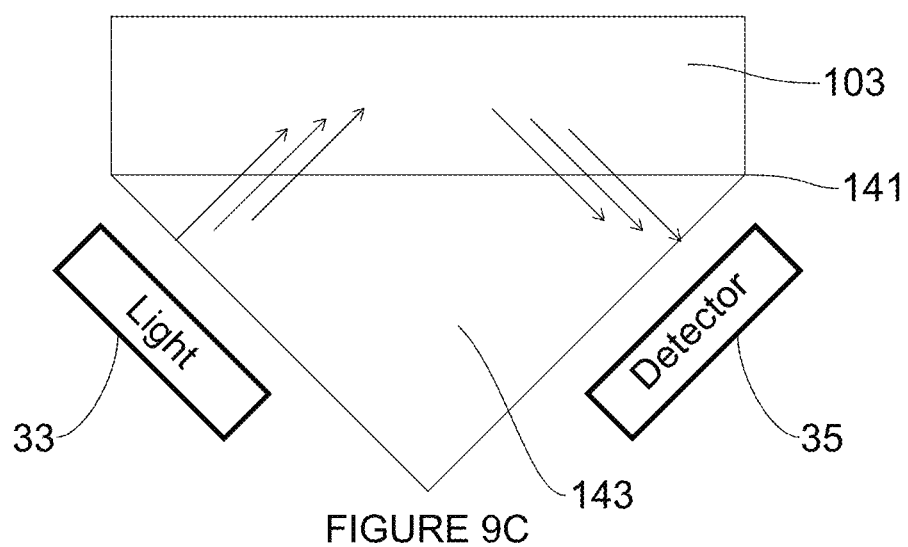
FIG. 9C is a schematic diagram of a means for attaching the light source and light detector using a prism.
Figure 9D:
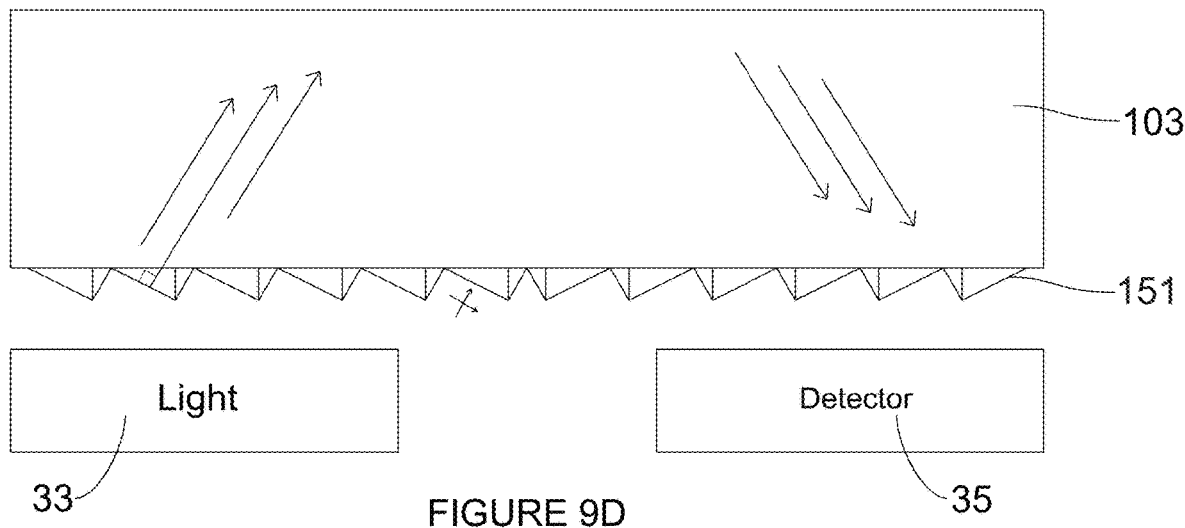
FIG. 9D is a schematic diagram of a means for attaching the light source and light detector using a Fresnel prism array.
Figure 9E:
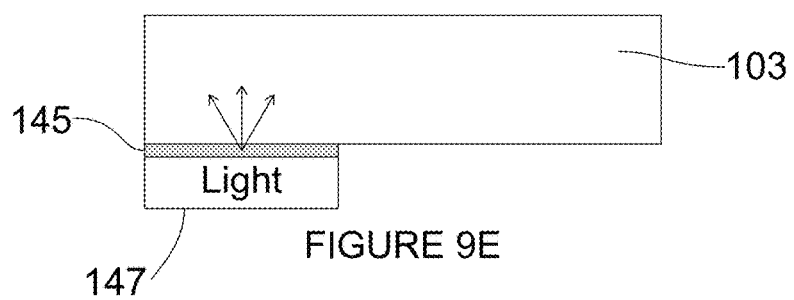
FIG. 9E is a schematic diagram of a means for optically bonding the light source and light detector using a fluorescent layer.
Figure 9F:
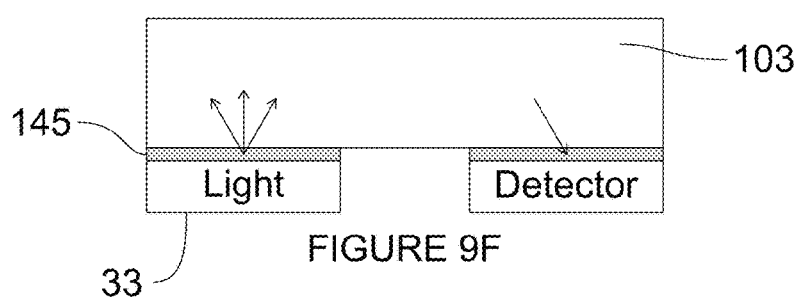
FIG. 9F is a schematic diagram of a means for optically bonding the light source and light detector using a thin-film diffraction layer.

101 Optical Coupling: Below are some methods used to optically couple the internal light source and measurement detector (camera or photo-diode) to the substrate. The incident angle of the light needs to be near the critical angle, to enable this optical coupling technique is required. For the internal light source, ideally this method will also diffuse the internal light to create a uniform intensity across the illumination area. For the measurement detector (camera or photo-diode) this method must not distort the image. Methods include:

a. Optical Epoxy: Referring to FIG. 9A, a schematic diagram of substrate 103 and the component, in this case the light source 33, the refractive index of the substrate 103 and component 33 are matched by use of an index-matching epoxy 141.

b. Scattering Layer: FIG. 9B is a schematic diagram where random surface texturing of substrate 103 and light source 33 creates a diffuser that is optically bonded by use of an index-matching epoxy 141.

c. Prism: FIG. 9C is a schematic diagram of the incorporation of a prism 143 that can be used to modify the incident angle of light as depicted to connect both light source 33 and detector 35 to substrate 103. Prism 143 is optically bonded to substrate 103 with an index-matching epoxy 141.

d. "Fresnel Prism": or micro-array of prisms can be used to non-contact, optically couple the light source and detector to the substrate with the benefit of reducing size. This is an array of micro-prisms designed so that light enters the prism normal to the input surface and after an internal reflection, exits normal to the output surface. This minimizes reflection loses, and eliminates refraction, at the input and output surface. It also ensures that the entire prism surface area is of clear aperture (no shadowing) for input and output light at the design angle. The array of micro-prisms can be etched into the substrate material, stamped onto the surface with a polymer, or fabricated from a polymer and then optically bonded to the substrate surface. FIG. 9D is a schematic diagram of an arrangement using a Fresnel prism. As can be seen in FIG. 9D, an array of Fresnel prisms 151 are either etched or added to the bottom surface of substrate 103. They are positioned between light source 33 and detector 35 and the substrate.

e. Fluorescent Layer: FIG. 9E is a schematic of diagram of an example of using a fluorescent material 145 that can be applied to the substrate surface 103 and irradiated with UV light by light source 147, which then fluoresces "internal light" with a higher wavelength. In the example shown, the fluorescent material is applied by embedding fluorescent particles in index-matching epoxy.

f. Diffraction: FIG. 9F is a schematic diagram of an example that uses a thin-film diffraction layer 149 that could be fabricated onto the surface of substrate 103 or alternatively a diffraction grating could be bonded onto to substrate 103 with index-matching epoxy to diffract light into substrate 103.

By way of example, Table I below provides one variation of an embodiment of the spatial filter of the present invention. It is meant only as one example of a spatial filter made according to the precepts of this disclosure.

TABLE 1

| Layer Designation | Layer Refractive Index | Design Refractive Index | Design Thickness | Design Material |
|---|---|---|---|---|
| 103 | n1 | 1.520 | 0.5 mm | glass substrate |
| 107 | n2 | 2.100 | 1,000 nm | Si$_3$N$_4$ |
| 109 | n3 | 1.471 | 110 nm | SiO$_2$ |
| 111 | n4 | 1.470 | 5,000 nm | SiO$_2$ |
| 113 | n3 | 1.471 | 110 nm | SiO$_2$ |
| 115 | n2 | 2.100 | 1,000 nm | Si$_3$N$_4$ |
| 119 | n4 | 1.470 | 110 nm | SiO$_2$ |
| 117 | n3 | 1.471 | 110 nm | SiO$_2$ |
| 105 | n5 | 1.520 | — | epoxy |
| 101 | n6 | 1.5-1.9 | λ/4 | Oxynitride |

The above described spatial filter can be fabricated using standard semiconductor fabrication processes. By way of example, the majority of the deposition process can be performed using plasma enhancement chemical vapor deposition (PEVCD). The above values for the refractive indexes are in part dependent on the materials used and the fabrication process. However, depending on the deposition process and materials chosen, the refractive indexes could have a range 1 to 5.0. Additionally, depending on the fabrication process and materials the difference between the refractive index of the cladding layer could be less than the anti-reflective layer from 0 to 5.0.

The dielectric materials are formed into the thin-film layers and are generally amorphous dielectrics. Plasma-enhanced chemical vapor deposition (PECVD) is used to fabricate most of the layers of the thin-film filter structure. This method provides the precision required for the deposition of each of the layers. The only layer that has the option of being a dielectric or polymer is the outer-most layer. The outer-most layer 119 of FIG. 8 can be made from a dielectric, a polymer, or a combination of the two different materials.

As previously noted, the detection region 43 of FIG. 1 consists of three different layers. The three layers as depicted in FIG. 8 are layers 119, 117 and 115. The three layers make up a basic spatial filter. The term "cladding detection layer" refers to the top-most layer at the air boundary of the device.

Of significance in the cladding detection layer is top coating 119 in FIG. 8, since it is in this layer where the thermally induced refractive index change takes place, by the absorption of infrared light. This top coating layer 119 can be composed of dielectric material ($SiO_2$, Calcium Fluoride, or Oxynitride) or polymer (polystyrene, PMMA, or other photoresists), and is typically patterned into individual pixels. The refractive index of this layer 119 must be carefully set so that it is the same or close to the refractive index of layer 111, depending on whether a negative or positive thermo-optic coefficient material is used, respectively. The advantage of using a polymer is due to its negative and significantly larger thermo-optic coefficient.

Figure 10:
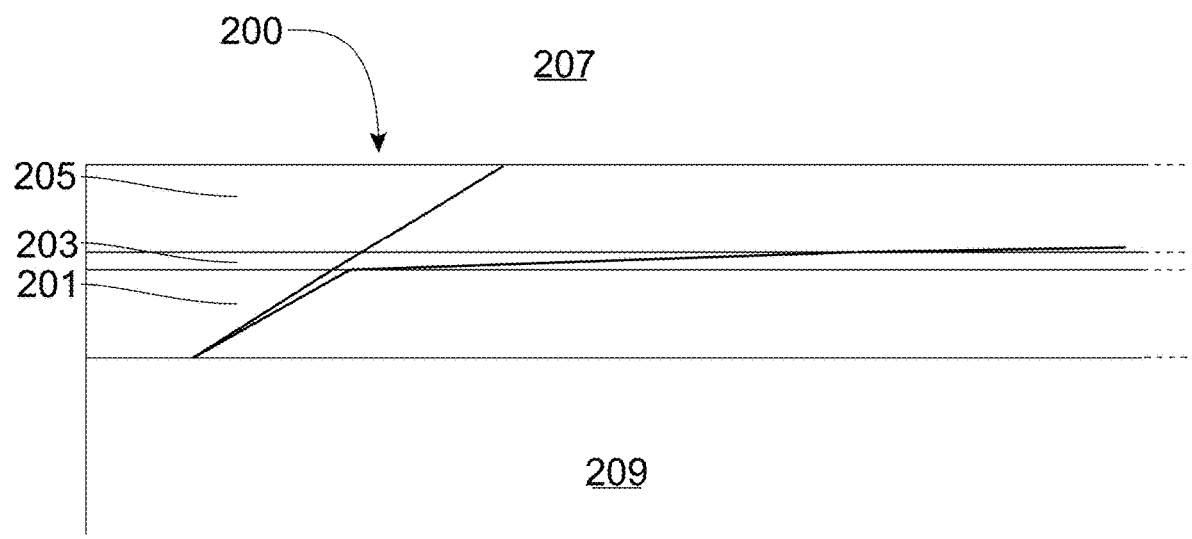
FIG. 10 is a schematic diagram of an embodiment of the basic spatial filter of the present invention.

A basic component of the invention is the single spatial filter 200 as depicted in FIG. 10. The basic spatial filter has a bottom high refractive index core layer 201 and typically composed of Silicon Nitride or similar material that has a refractive index typically in the range of 2.1 by way of example. A near-critical angle, anti-reflective (AR) layer 203, which can be composed of Silicon Dioxide or similar material with its refractive index in the range of 1.461. A top layer 205 with low refractive index and typically composed of Silicon Dioxide which has a refractive index 1.460. As is noted in detail elsewhere, the very top layer which is exposed to air 207. Top layer 205 is referred to herein in some instances as the cladding detection layer. This cladding detection layer or just cladding layer, is unique unto itself. In a preferred embodiment, cladding detection layer has an index slightly less than AR layer 203. In the example schematically depicted in FIG. 10, it has a refractive index just 0.001 less than the refractive index of anti-reflection layer 203. In the embodiment of the invention depicted in the spatial filter 200, since the filter structure of the three layers are in the form of a thin film, they have an underlying substrate 207 to provide a base. The substrate and its makeup are discussed above at length.

The structure in FIG. 10 as noted is the simplest embodiment of the spatial filter of the present invention, which as noted has a high refractive index (core) layer, a low refractive index (cladding) layer and a near-critical angle, anti-reflection layer in between. This structure filters the internal light by only permitting the efficient transmission of a narrow band of angles very close to the critical angle. Also, due to its proximity to the critical angle, strong refraction occurs which causes a lateral displacement of the transmitted light as it passes through the near-critical angle, anti-reflection coating 203 and the low refractive index (cladding) layer 205. This effect further spatially filters the internal light. This is a unique solution to the near-critical angle spatial filter equations and has not been considered or demonstrated in prior art. This design, transmission from a solid dielectric 203 into another solid dielectric 205, requires that the refractive index of the near-critical angle anti-reflection coating 203 be greater than, but very close in value to the low refractive index (cladding) layer, typically on the order of 0.001. Prior art has only considered the case of transmission from solid dielectric into gaseous air. For this case the difference between the refractive index of the near-critical angle anti-reflection coating layer is much larger. It is the small refractive index difference between the two layers mentioned above that results in the structure's sensitivity to small refractive index changes, in this case, due to the absorption of infrared radiation.

To create a spatial filter with a high degree of edge steepness as a function of angle of incidence, the reflectance slope is maximized. The highest reflectance slope appears near the critical angle of total internal reflection. This optical effect can be used to design a thin-film filter to cancel the reflected plane-wave front if it is incident at an angle slightly smaller than that of the critical angle at the film-substrate. Textbooks, patents, and scientific literature contain many mathematical methods and formalisms to obtain our solutions. The following are the most basic equations that can be used to find a numerical solution.

Input angle, $\theta_1$ $$\theta_2 = \arcsin(n_4 \sin\theta_1 / n_3)$$

$$\theta_3 = \arcsin(n_4 \sin\theta_1 / n_2)$$

Reflectance Amplitude, p polarization:

$$r_{12p} = \frac{n_3\cos\theta_1 - n_4\cos\theta_2}{n_3\cos\theta_1 + n_4\cos\theta_2}$$

$$r_{23p} = \frac{n_2\cos\theta_2 - n_3\cos\theta_3}{n_2\cos\theta_2 + n_2\cos\theta_3}$$

Reflectance Amplitude, s polarization:

$$r_{12s} = \frac{n_4\cos\theta_1 - n_3\cos\theta_2}{n_4\cos\theta_1 + n_3\cos\theta_2}$$

$$r_{23s} = \frac{n_3\cos\theta_2 - n_2\cos\theta_3}{n_3\cos\theta_2 + n_2\cos\theta_3}$$

Reflectance Percentage for the coated surface:

$$R_p = \frac{r_{12p}^2 + r_{23p}^2 + 2r_{12p}r_{23p}\cdot\cos 2\beta}{1 + r_{12p}^2 + r_{23p}^2 + 2r_{12p}r_{23p}\cdot\cos 2\beta}$$

$$R_s = \frac{r_{12s}^2 + r_{23s}^2 + 2r_{12s}r_{23s}\cdot\cos 2\beta}{1 + r_{12s}^2 + r_{23s}^2 + 2r_{12s}r_{23s}\cdot\cos 2\beta}$$

$$\overline{R} = \frac{1}{2}(R_p + R_s)$$

$$\beta = \frac{2\pi}{\lambda}n_3 h \cos\theta_2$$

where $\overline{R}$ is the average reflectance, $\beta$ (in radians) is the phase difference in the external medium between waves reflected from the first and second surfaces of the coating, h is the thickness of the coating, and $\lambda$ is the wavelength. The variables are $\lambda$, n2, n3, n4, and $\Delta\theta$, the proximity to the critical angle. Once the variables are set, the equations can be numerically solved for the minimum reflectance by varying h and $\Delta\theta$. A good solution typically results in the lowest reflectance for s and p polarization light having similar values.

The example of infrared imager 31 structure in FIG. 8 has three different spatial filters similar to that depicted in FIG. 10. In FIG. 8, the three different spatial filters are the following combination of layers starting from substrate 103: $1^{st}$ spatial filter layers 107, 109 and 111; $2^{nd}$ spatial filter layers 111, 113 and 115; and $3^{rd}$ spatial filter layers 115, 117 and 119. As can be seen, each filter has in the direction of the injected light that will pass through them a first high refractive index layer, an anti-reflective coating with a refractive index lower than the first layer and a third low refractive index layer. The number of stacked layers depicted in FIG. 8 is just one example, and the actual number of stacked layers of spatial filters will depend on the intended use.

Figure 11:
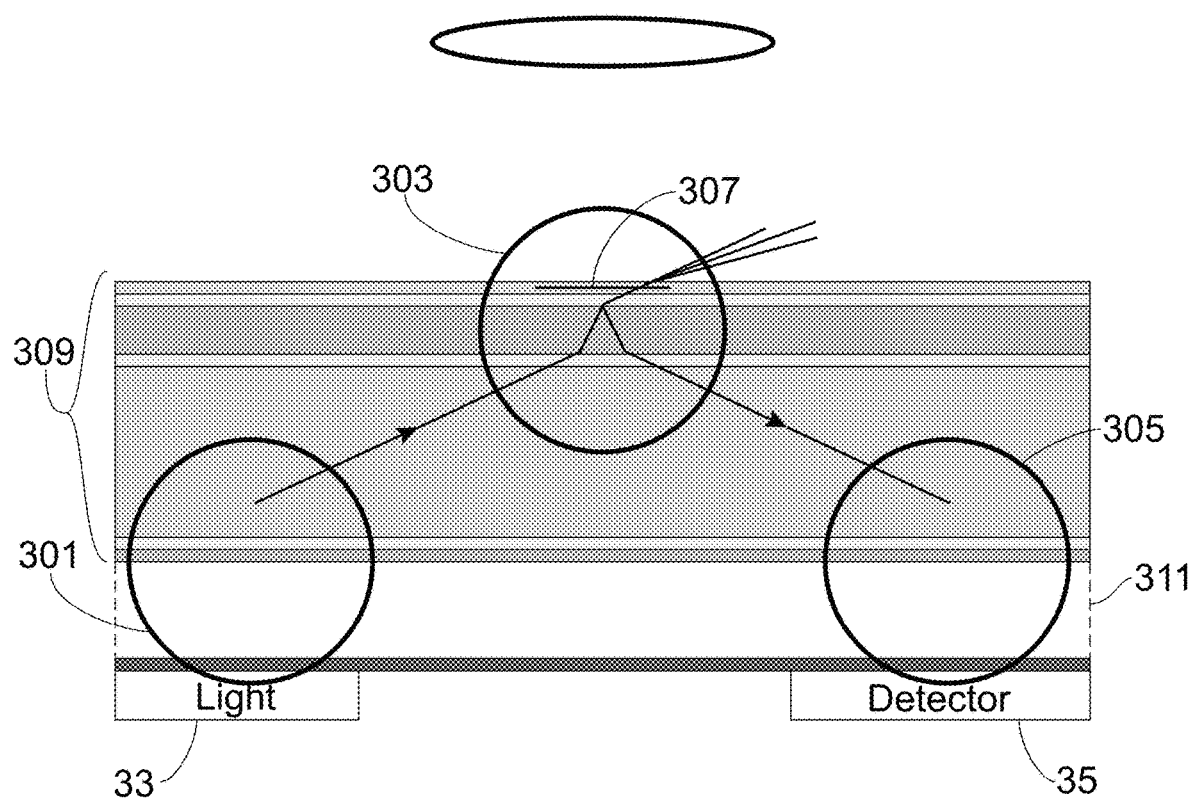
FIG. 11 is a schematic diagram of an embodiment of the infrared imager of the present invention with the various functional areas identified.

Referring to FIG. 11, a schematic diagram of the infrared imager shows the various uses of the spatial filters of infrared imager 300. It essentially is three regions indicated by the numbered circles: a) a Reference Region 301 that filters the light from internal light source 33 both spatially and spectrally. The light which is transmitted through this region is the "internal light" or sometimes referred to as the "injected light." b) Detection Region 303 is where the internal light is either transmitted out of the "Thin-Film Stack," the layers 309 above substrate 311 or reflected to the measurement region 305, depending on the absorption of infrared light at the exposed surface of cladding detection layer 307. c) Measurement Region 305 is an optical noise filter preventing any scattered light from the "Detection Region" from transmitting to camera 35. This region also has the camera or photodiode and measures the "Internal Light" intensity or even captures an image from the infrared light irradiating cladding detection layer 307.

As noted, cladding detection layer is of unique importance for the present invention. The top coating or "cladding detection layer" has a unique structure and is reactive to irradiation by infrared light which causes a change of the refractive index of the cladding detection layer—the variation in the change of the refractive index is proportional to the intensity of the infrared radiation.

All of the other layers of the thin-film filter structure are made of a dielectric material with the exception of the cladding detection layer, which can be made of either a polymer or a dielectric. The key feature of the top-most cladding detection layer is that its refractive index changes when irradiated by infrared light. The change in refractive index causes the critical angle to shift. The magnitude of the change is dependent of the material of the layer's thermo-optical coefficient, or $\Delta n/\Delta T$, which is the change in refractive index for a change in temperature by 1 degree Celsius. The temperature change being the result of infrared light impacting the top cladding detection layer. The larger the thermo-optical coefficient of the material, the greater the change of the refractive index and the more sensitive the device. This coefficient also has positive or negative sign (+, −) which indicates the direction of the shift of the change in the refractive index. Typically, dielectrics have thermo-optical coefficients of an order of $10^{-6}$ and polymers have coefficients of $-10^{-3}$. The direction the refractive index changes, increasing or decreasing, determines the direction the critical angle changes by, increasing or decreasing. Polymers will have a change in refractive index 1,000× greater per degree of temperature change than dielectrics, representing a significant increase in device sensitivity. A polymer-dielectric "hybrid" layer combination could be used to enhance and fine tune performance. Oxynitride ($SiN_xO$) is an example of a dielectric material that can be used in combination with a polymer as its refractive index can be tuned to be nearly identical to polymers, particularly commercial photoresists such as Poly(methyl methacrylate) (PMMA) and SU-8 photoresist.

This layer must also be designed to enable the efficient exit of visible light from the layer into the air above. If composed of dielectric material, this can be accomplished by fabricating the layer into a pattern or by roughening the surface to induce scattering. If a polymer is used, an additive can be included as well, such as nano-particles, to induce scattering.

Figure 12A:
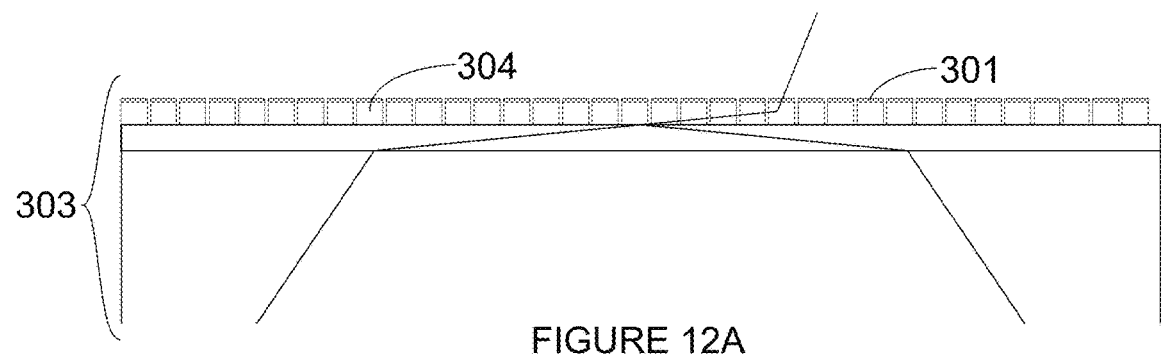
FIG. 12A is a schematic diagram of one variation of the top three layers of the infrared imager.
Figure 12B:
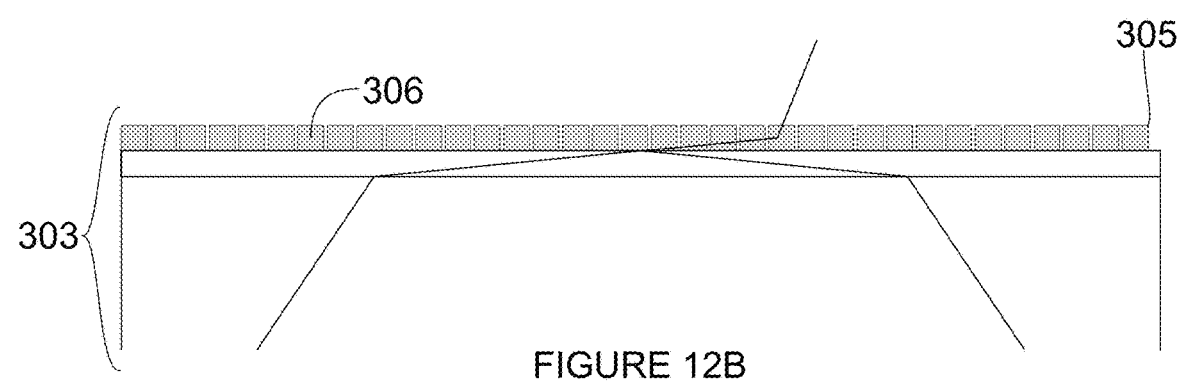
FIG. 12B is a schematic diagram of a second variation of the top three layers of the infrared imager.
Figure 12C:
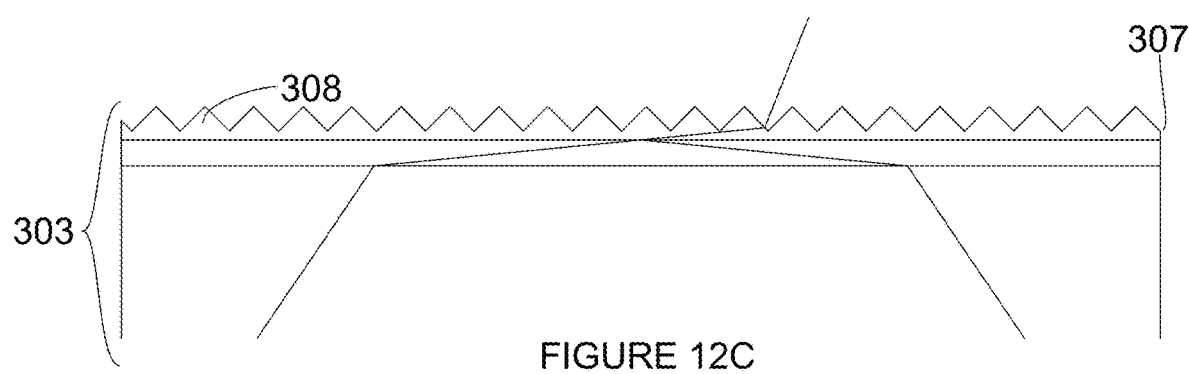
FIG. 12C is a schematic diagram of a third variation of the top three layers of the infrared imager.
Figure 12D:
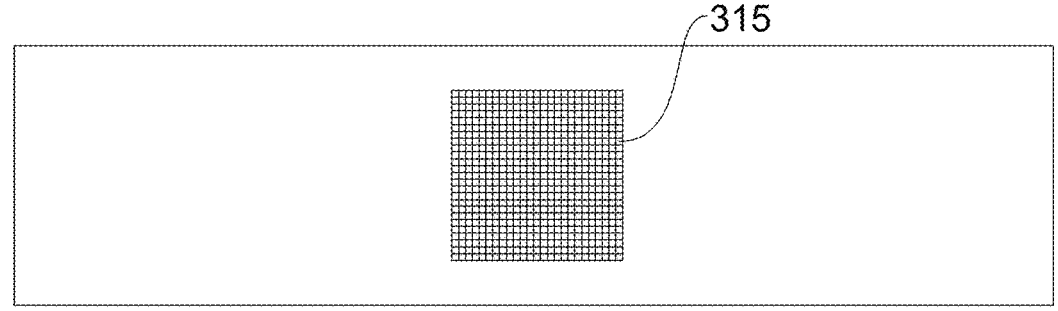
FIG. 12D is a schematic diagram of the top surface of the cladding detection layer from the direction of incident infrared radiation.

FIG. 12A is a schematic diagram of one variation of top coating 301 of cladding detection layer 303. In this variation, the top surface 304 has a rough surface, as opposed to optically flat, equivalent to a pixelated scattering surface. Roughening can be implemented mechanically or via a chemical etching process. FIG. 12B is a schematic diagram of another variation of the top coating 305 that has embedded nano-particles 306 to create a pixelated scattering volume. This is typically done by incorporating nano-particles, such as carbon nano-tubes, into a polymer and spin coating it into said layer. FIG. 12C is another variation in which top coating 307 has a pixelated scattering geometry due to nano-fabricated pyramid structures 308. The pyramid structures 308 can be two-dimensional or three-dimensional. These pyramid structures can be made using standard photolithography and etched into the dielectric surface. They can be etched or stamped if the surface is a polymer. FIG. 12D is a view of the top of the detection area from the direction that infrared light would irradiate the detection surface. Since the infrared light is in the form of an image, it irradiates the cladding detection area in varying degrees of intensity to thereby cause varying amounts of injected internal light to pass out of the top surface or to be reflected down to the camera. The refractive index of the cladding detection area will vary across the surface to cause this.

It should be noted that the critical angle can vary over the cladding detection layer allowing some of the injected light to escape and some to be reflected back down. Thus, if there is an image in the infrared light irradiating the cladding detection layer it will transfer this image to the injected light by causing some of it to exit the cladding detection layer at an angle less that the critical angle, and some of the injected light to reflect down out of the cladding detection layer towards imaging device or camera.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An optical infrared (IR) imager, comprising:
   a transparent substrate layer;
   a light source and a light detector spaced apart laterally relative to one another on a first side of the substrate layer;
   at least a first spatial filter disposed on a second side of the substrate layer, a first side of the first spatial filter being optically coupled to the substrate layer, the first spatial filter including an anti-reflective layer having a near critical angle; and
   a cladding detection layer disposed on a second side of the first spatial filter, the cladding detection layer having a refractive index that is modulated by infrared light incident on an exterior surface of the cladding detection layer;

wherein when the light source injects light into the substrate layer, the injected light passes through the substrate layer into the at least first spatial filter and is spectrally and spatially filtered by wave interference and strong refraction such that the injected light impinges the cladding detection layer at a predetermined angle near a critical angle of the injected light, and when infrared light impinges the exterior surface of the cladding detection layer, the refractive index of the cladding detection layer is modulated and thereby changes an amount of injected light reflected through the at least first spatial filter from the cladding detection layer through the at least first spatial filter to the light detector; and wherein a combined thickness of the first spatial filter and cladding detection layer is equal to or greater than about 3500 nm.

2. The imager according to claim 1, wherein the predetermined angle is slightly less than a critical angle of incidence of the injected light when no infrared light impinges on the exterior surface of the cladding detection layer such that the injected light passes out through the exterior surface of the cladding detection layer, and when infrared light impinges on the exterior surface of the cladding detection layer, the refractive index of the cladding detection layer is modulated such that the predetermined angle of the injected light is equal to or more than the critical angle of incidence and the injected light is reflected from the cladding detection layer down through the at least first spatial filter and the substrate layer to the light detector.

3. The imager according to claim 1, wherein the at least spatial filter further comprises a core layer having a refractive index that is greater than the refractive index of the anti-reflective layer and the cladding detection layer, the core layer being disposed between the substrate layer and the anti-reflective layer.

4. The imager according to claim 1, wherein the cladding detection layer comprises a material having a positive thermo-optic coefficient.

5. The imager according to claim 4, wherein the material having a positive thermo-optic coefficient is a dielectric.

6. The imager according to claim 1, further comprising an optical coupling layer disposed on the first side of the substrate layer and being configured to operatively couple the light source and the light detector with the substrate layer.

7. The imager according to claim 6, wherein the optical coupling layer is configured to diffuse internal light generated by the light source to thereby create a uniform intensity across an illumination area of the light source.

8. The imager according to claim 1, further comprising a blackbody absorbing material disposed on an exterior surface of the cladding detection layer and configured to absorb infrared light that impinges the exterior surface of the cladding detection layer.

9. The imager according to claim 1, wherein an exterior surface of the cladding detection layer is configured to scatter both internal visible light and incident infrared light.

10. An optical infrared (IR) imager, comprising:
a transparent substrate layer;
a light source and a light detector spaced apart laterally relative to one another on a first side of the substrate layer;

at least a first spatial filter disposed on a second side of the substrate layer, a first side of the first spatial filter being optically coupled to the substrate layer, the first spatial filter including an anti-reflective layer having a near critical angle; and a cladding detection layer disposed on a second side of the first spatial filter, the cladding detection layer having a refractive index that is modulated by infrared light incident on an exterior surface of the cladding detection layer;

wherein when the light source injects light into the substrate layer, the injected light passes through the substrate layer into the at least first spatial filter and is spectrally and spatially filtered by wave interference and strong refraction such that the injected light impinges the cladding detection layer at a predetermined angle near a critical angle of the injected light, and when infrared light impinges the exterior surface of the cladding detection layer, the refractive index of the cladding detection layer is modulated and thereby changes an amount of injected light reflected through the at least first spatial filter from the cladding detection layer through the at least first spatial filter to the light detector; and wherein the refractive index of the cladding detection layer is 0.001 or less than the refractive index of the anti-reflective layer.

11. The imager according to claim 10, wherein the at least spatial filter further comprises a core layer having a refractive index that is greater than the refractive index of the anti-reflective layer and the cladding detection layer, the core layer being disposed between the substrate layer and the anti-reflective layer.

12. An optical infrared (IR) imager, comprising:
a transparent substrate layer;
a light source and a light detector spaced apart laterally relative to one another on a first side of the substrate layer;

at least a first spatial filter disposed on a second side of the substrate layer, a first side of the first spatial filter being optically coupled to the substrate layer, the first spatial filter including an anti-reflective layer having a near critical angle; and a cladding detection layer disposed on a second side of the first spatial filter, the cladding detection layer having a refractive index that is modulated by infrared light incident on an exterior surface of the cladding detection layer;

wherein when the light source injects light into the substrate layer, the injected light passes through the substrate layer into the at least first spatial filter and is spectrally and spatially filtered by wave interference and strong refraction such that the injected light impinges the cladding detection layer at a predetermined angle near a critical angle of the injected light, and when infrared light impinges the exterior surface of the cladding detection layer, the refractive index of the cladding detection layer is modulated and thereby changes an amount of injected light reflected through the at least first spatial filter from the cladding detection layer through the at least first spatial filter to the light detector;

wherein the at least spatial filter further comprises a core layer having a refractive index that is greater than the refractive index of the anti-reflective layer and the cladding detection layer, the core layer being disposed between the substrate layer and the anti-reflective layer; and wherein the imager further comprises at least a second spatial filter disposed between the substrate layer and the core layer, the second spatial filter comprising a second anti-reflective layer.

13. An optical infrared (IR) imager, comprising:

a transparent substrate layer;

a light source and a light detector spaced apart laterally relative to one another on a first side of the substrate layer;

at least a first spatial filter disposed on a second side of the substrate layer, a first side of the first spatial filter being optically coupled to the substrate layer, the first spatial filter including an anti-reflective layer having a near critical angle; and a cladding detection layer disposed on a second side of the first spatial filter, the cladding detection layer having a refractive index that is modulated by infrared light incident on an exterior surface of the cladding detection layer;

wherein when the light source injects light into the substrate layer, the injected light passes through the substrate layer into the at least first spatial filter and is spectrally and spatially filtered by wave interference and strong refraction such that the injected light impinges the cladding detection layer at a predetermined angle near a critical angle of the injected light, and when infrared light impinges the exterior surface of the cladding detection layer, the refractive index of the cladding detection layer is modulated and thereby changes an amount of injected light reflected through the at least first spatial filter from the cladding detection layer through the at least first spatial filter to the light detector; and wherein the cladding detection layer comprises a material having a negative thermo-optic coefficient.

14. The imager according to claim 13, wherein the material having a negative thermo-optic coefficient is a polymer.

15. An optical infrared (IR) imager, comprising:

a transparent substrate layer;

a light source and a light detector spaced apart laterally relative to one another on a first side of the substrate layer;

at least a first spatial filter disposed on a second side of the substrate layer, a first side of the first spatial filter being optically coupled to the substrate layer, the first spatial filter including an anti-reflective layer having a near critical angle; and a cladding detection layer disposed on a second side of the first spatial filter, the cladding detection layer having a refractive index that is modulated by infrared light incident on an exterior surface of the cladding detection layer;

wherein when the light source injects light into the substrate layer, the injected light passes through the substrate layer into the at least first spatial filter and is spectrally and spatially filtered by wave interference and strong refraction such that the injected light impinges the cladding detection layer at a predetermined angle near a critical angle of the injected light, and when infrared light impinges the exterior surface of the cladding detection layer, the refractive index of the cladding detection layer is modulated and thereby changes an amount of injected light reflected through the at least first spatial filter from the cladding detection layer through the at least first spatial filter to the light detector;

wherein the imager further comprises an optical coupling layer disposed on the first side of the substrate layer and being configured to operatively couple the light source and the light detector with the substrate layer;

wherein the optical coupling layer comprises at least one of an index matching epoxy, a prism, a Fresnel prism micro array, a fluorescent array, a diffraction layer and a diffraction grating.

16. An optical imaging device, comprising:

a light source;

at least one spatial filter, the spatial filter including an anti-reflective layer with a near critical angle;

a cladding detection layer; and a light detector adapted to receive light from the light source that has passed through the spatial filter;

wherein the light source, the spatial filter, the cladding detection layer, and the light detector are optically connected and positioned with respect to each other such that when the light source emits light, the emitted light passes through the spatial filter and is directed by the spatial filter to the cladding detection layer where the light strikes the cladding detection layer at a predetermined angle near a critical angle of the emitted light, and the cladding detection layer has a variable refractive index, such that when irradiated with infrared light on an exterior surface of the cladding detection layer, the refractive index of the cladding detection layer changes to thereby cause a change in the amount of emitted light that the light detector receives through the spatial filter;

wherein a combined thickness of the spatial filter and cladding detection layer is equal to or greater than about 3500 nm.

17. The optical imaging device according to claim 16, wherein an exterior surface of the cladding detection layer is configured to scatter both internal visible light and incident infrared light.

18. The optical imaging device according to claim 16, further comprising a blackbody absorbing material disposed on an exterior surface of the cladding detection layer and configured to absorb infrared light that impinges the exterior surface of the cladding detection layer.

19. An optical imaging device, comprising:

a light source;

at least one spatial filter, the spatial filter including an anti-reflective layer with a near critical angle;

a cladding detection layer; and a light detector adapted to receive light from the light source that has passed through the spatial filter;

wherein the light source, the spatial filter, the cladding detection layer, and the light detector are optically connected and positioned with respect to each other such that when the light source emits light, the emitted light passes through the spatial filter and is directed by the spatial filter to the cladding detection layer where the light strikes the cladding detection layer at a predetermined angle near a critical angle of the emitted light, and the cladding detection layer has a variable refractive index, such that when irradiated with infrared light on an exterior surface of the cladding detection layer, the refractive index of the cladding detection layer changes to thereby cause a change in the amount of emitted light that the light detector receives through the spatial filter; and wherein the refractive index of the cladding detection layer is 0.001 or less than the refractive index of the anti-reflective layer.

\* \* \* \* \*